(12) United States Patent
Chen et al.

(10) Patent No.: US 12,336,235 B2
(45) Date of Patent: Jun. 17, 2025

(54) SEMICONDUCTOR DEVICE HAVING ISOLATION STRUCTURE FORMED OF LOW-K DIELECTRIC MATERIAL AND METHOD FOR FORMING THE SAME

(71) Applicant: Taiwan Semiconductor Manufacturing Company, Ltd., Hsinchu (TW)

(72) Inventors: Szu-Hua Chen, Tainan (TW);
Cheng-Ming Lin, Kaohsiung (TW);
Han-Yu Lin, Nantou County (TW);
Wei-Yen Woon, Taoyuan (TW);
Ming-Jie Huang, Hsinchu (TW);
Ting-Gang Chen, Taipei (TW);
Tai-Chun Huang, Hsin-Chu (TW);
Ming-Chang Wen, Kaohsiung (TW);
Szuya Liao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 298 days.

(21) Appl. No.: 17/869,791

(22) Filed: Jul. 21, 2022

(65) Prior Publication Data

US 2024/0030281 A1    Jan. 25, 2024

(51) Int. Cl.
*H10D 62/10* (2025.01)
*H01L 21/28* (2025.01)
*H10D 62/13* (2025.01)

(52) U.S. Cl.
CPC ..... *H10D 62/115* (2025.01); *H01L 21/28194* (2013.01); *H10D 62/151* (2025.01)

(58) Field of Classification Search
CPC ............. H01L 29/0649; H01L 29/0847; H01L 29/0673; H01L 21/28194; H01L 21/76232; H10D 62/115; H10D 62/151; H10D 30/0221; H10D 84/144; H10D 84/201
See application file for complete search history.

(56) References Cited

U.S. PATENT DOCUMENTS

| | | | | |
|---|---|---|---|---|
| 2019/0164837 A1* | 5/2019 | Hung | ................ | H01L 21/76224 |
| 2019/0393220 A1* | 12/2019 | Na | .................. | H01L 21/823821 |
| 2020/0006342 A1* | 1/2020 | Cho | ................... | H01L 29/0649 |
| 2020/0027981 A1* | 1/2020 | Park | .................... | H01L 29/7827 |
| 2020/0212217 A1* | 7/2020 | Yu | ..................... | H01L 21/823431 |
| 2021/0098309 A1* | 4/2021 | Min | ................. | H01L 21/823481 |
| 2022/0173097 A1* | 6/2022 | Yang | .................. | H01L 27/0886 |
| 2024/0312843 A1* | 9/2024 | Lin | ................. | H01L 21/823431 |

* cited by examiner

*Primary Examiner* — Dao H Nguyen
(74) *Attorney, Agent, or Firm* — JCIPRNET

(57) ABSTRACT

A semiconductor device having a low-k isolation structure and a method for forming the same are provided. The semiconductor device includes channel structures, laterally extending on a substrate; gate structures, intersecting and covering the channel structures; and a channel isolation structure, laterally penetrating through at least one of the channel structures, and extending between separate sections of one of the gate structures along an extending direction of the one of the gate structures. A low-k dielectric material in the channel isolation structure comprises boron nitride.

14 Claims, 13 Drawing Sheets

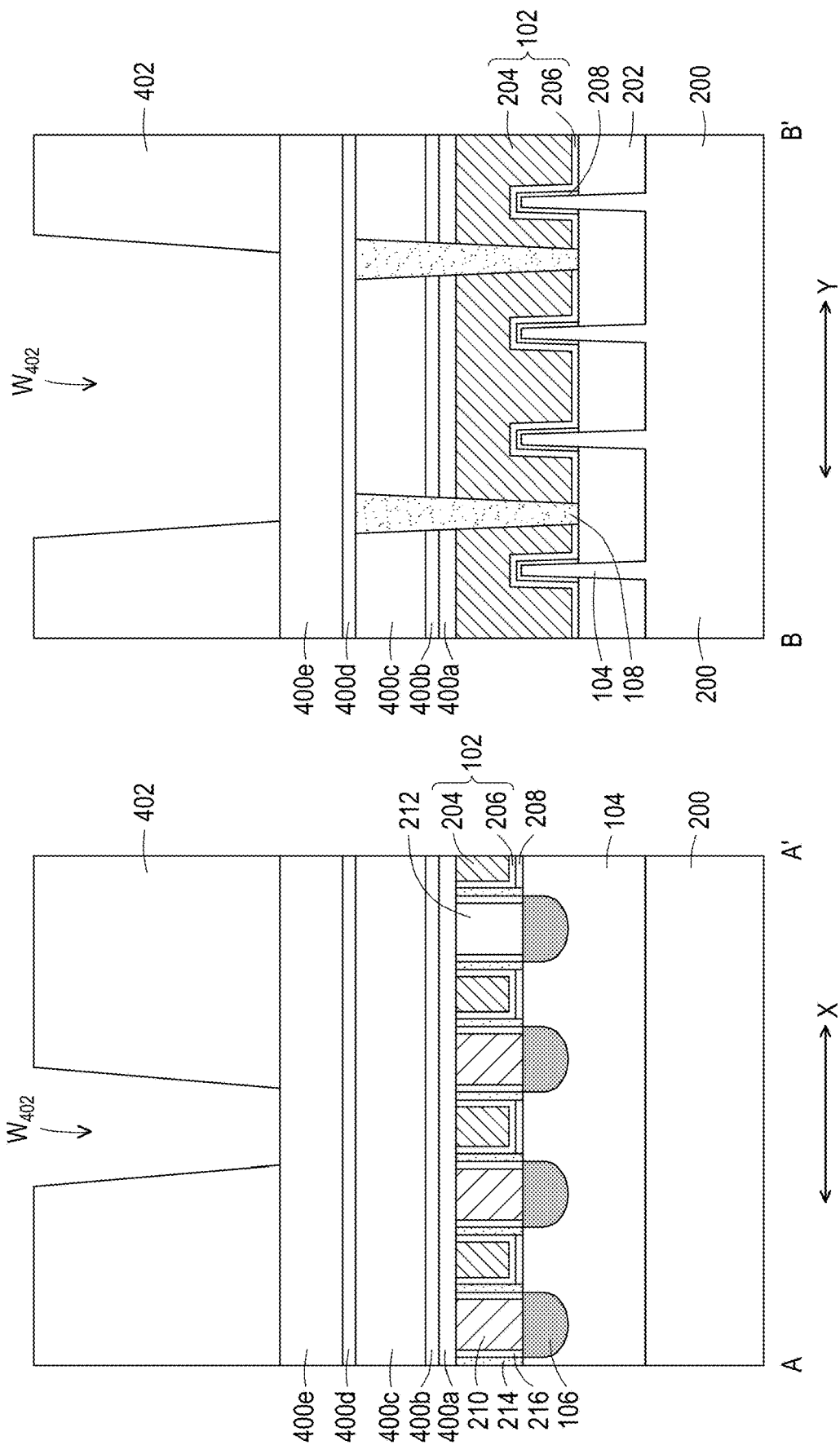

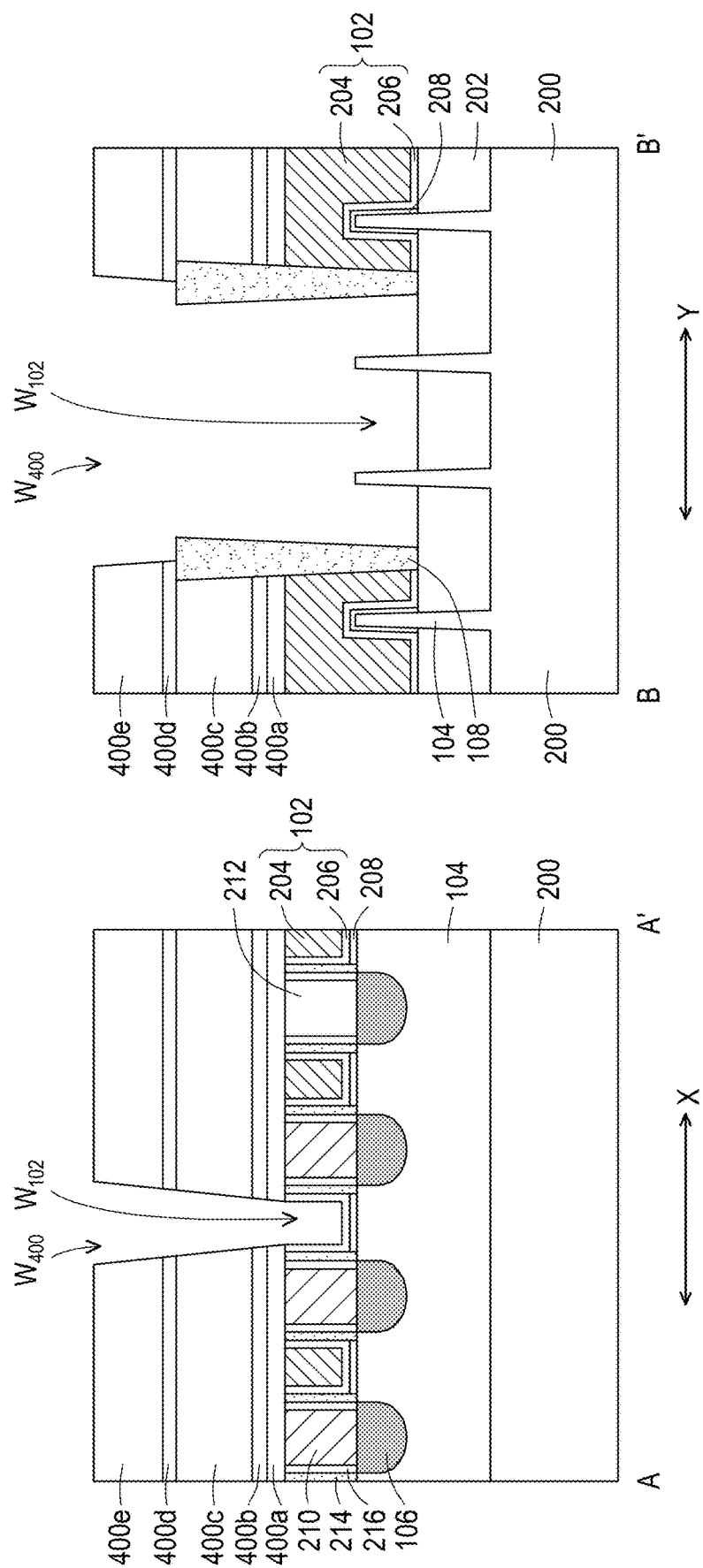

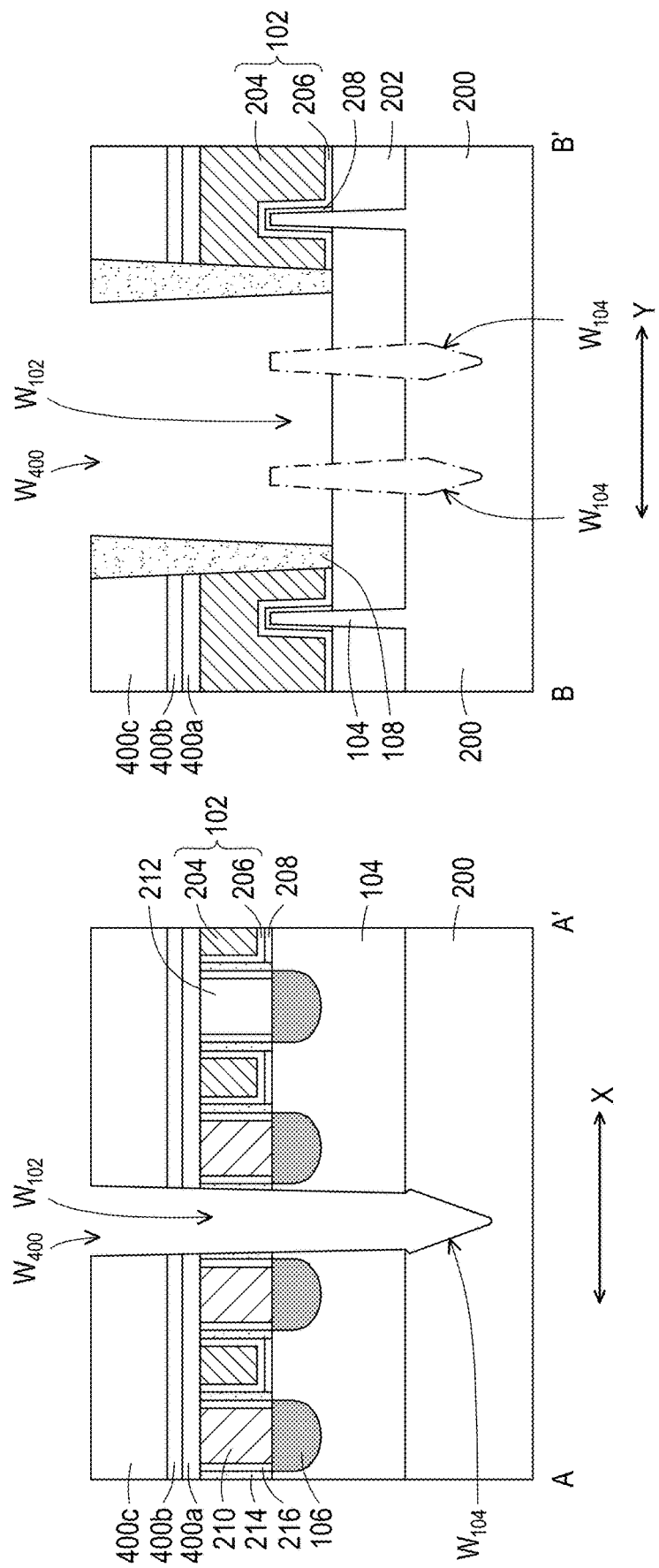

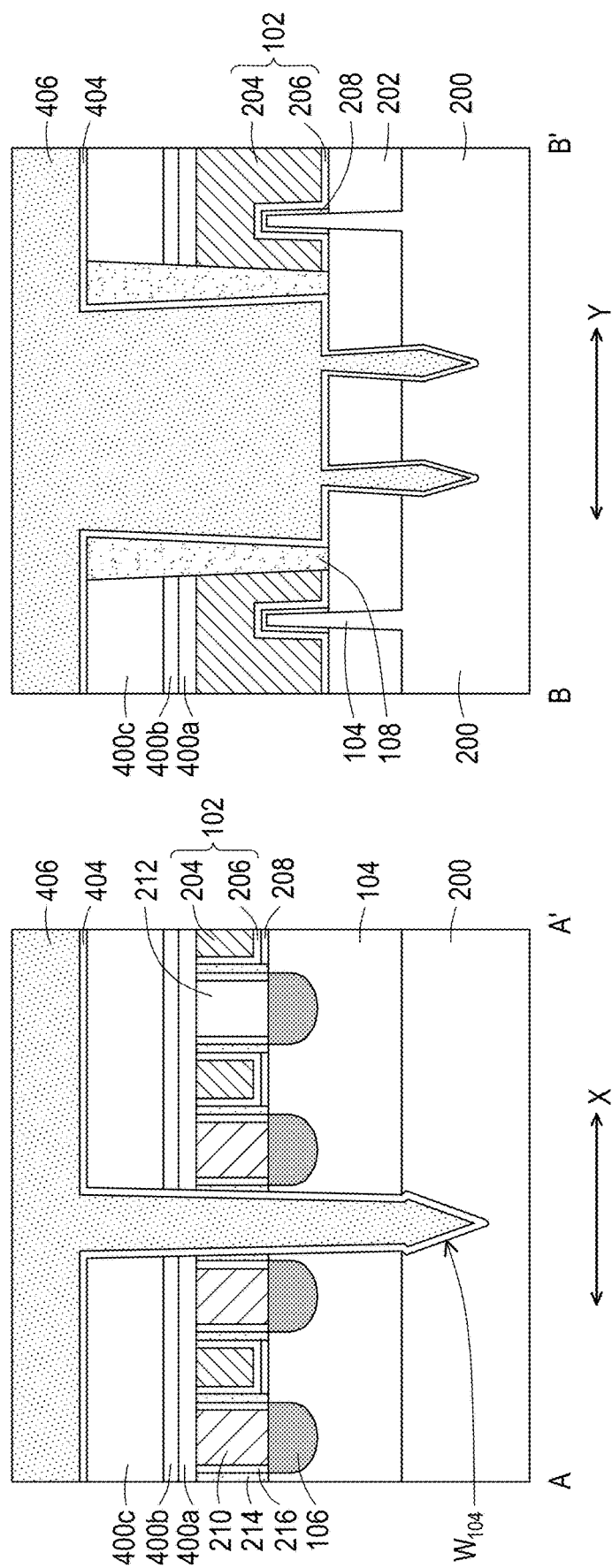

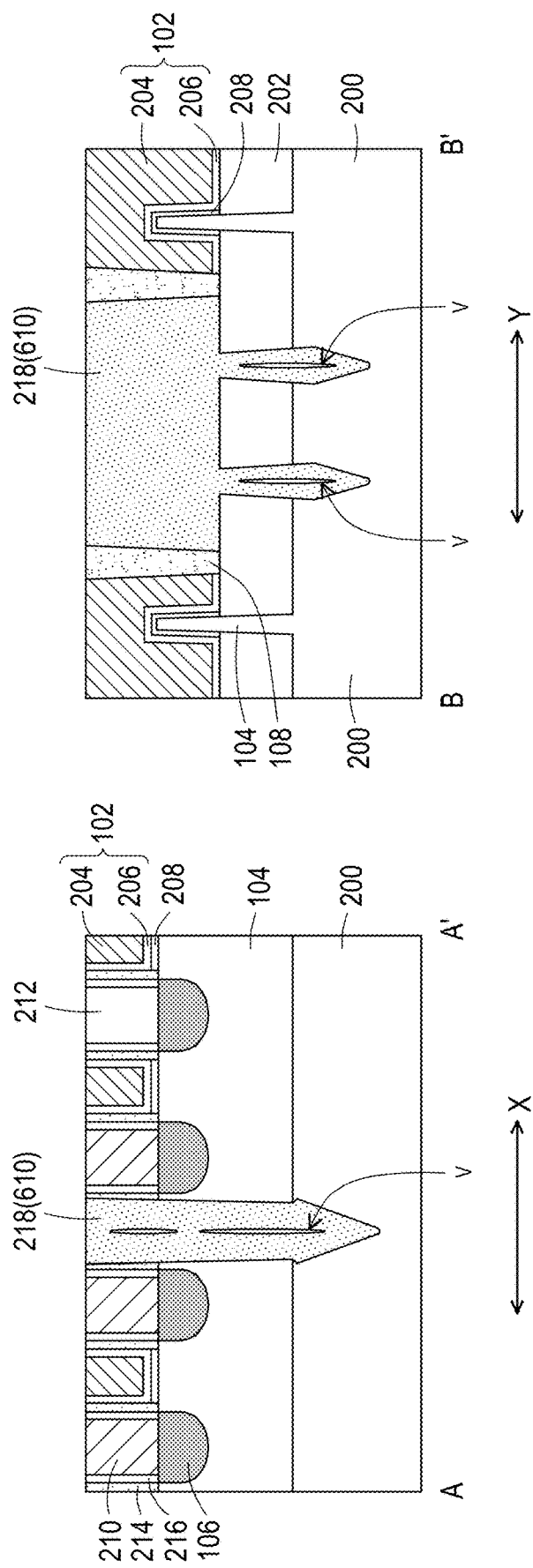

SEMICONDUCTOR DEVICE HAVING ISOLATION STRUCTURE FORMED OF LOW-K DIELECTRIC MATERIAL AND METHOD FOR FORMING THE SAME

BACKGROUND

Field effect transistors (FETs) include channel structures extending between source and drain terminals and capacitively coupled to gate terminals. Generally, an array of the channel structures are initially formed, to minimize etch bias due to pattern density difference in different regions. Afterwards, some of the channel structures may be cut into separate sections, and an insulating material may be filled into spacing therebetween, to provide proper isolation between adjacent sections of the channel structures. Along with scaling down of the FETs, a width of the insulating material between adjacent sections of the channel structure may be reduced, and a resistance-capacitance (RC) delay resulted from the insulating material and conductive features at opposite sides of the insulating material is accordingly increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A, FIG. 4C, FIG. 4E, FIG. 4G and FIG. 4I are schematic cross-sectional views illustrating structures along a channel structure at various intermediate stages of the process as shown in FIG. 3.

FIG. 4B, FIG. 4D, FIG. 4F, FIG. 4H and FIG. 4J are schematic cross-sectional views illustrating structures along a gate structure at various intermediate stages of the process as shown in FIG. 3.

FIG. 6A is a schematic cross-sectional view illustrating a cross-section along a channel structure intersected with a channel isolation structure, according to some embodiments of the present disclosure.

FIG. 6B is a schematic cross-sectional view illustrating a cross-section along the channel isolation structure shown in FIG. 6A, according to some embodiments in the present disclosure.

DETAILED DESCRIPTION

Figure 1:
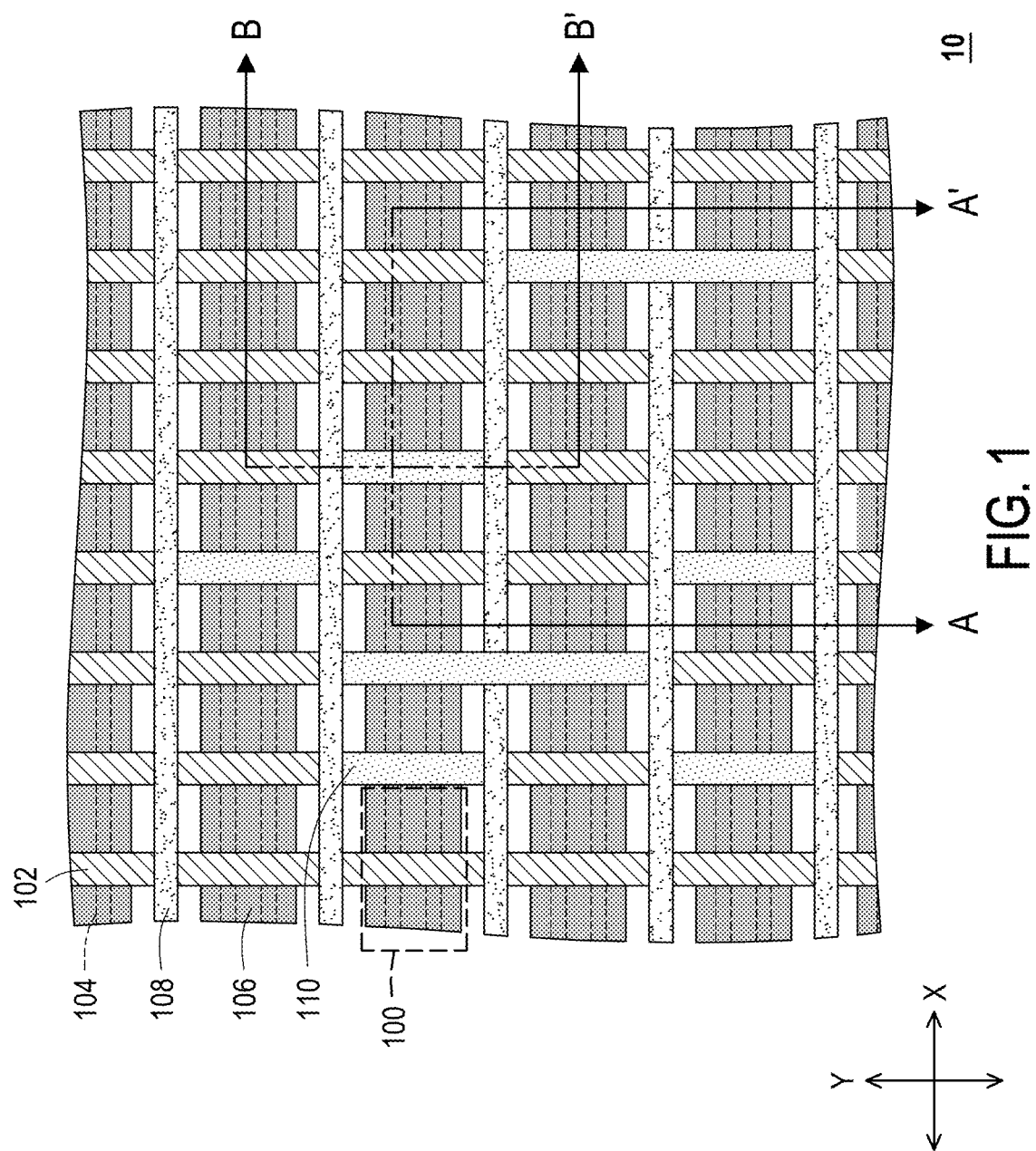
FIG. 1 is a schematic plan view illustrating a semiconductor device, according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic plan view illustrating a semiconductor device 10, according to some embodiments of the present disclosure.

Referring to FIG. 1, the semiconductor device 10 includes a plurality of field effect transistors (FETs) 100. Each FET 100 is defined at an intersection area of a gate structure 102 and at least one channel structure 104 intersecting and being covered by the gate structure 102. In some embodiments, some of the FETs 100 are respectively defined at an intersection area of one gate structure 102 and two channel structures 104 as shown in FIG. 1, while others of the FETs 100 (not shown) may be respectively defined at an intersection area of one gate structure 102 and a single channel structure 104 or more than two channel structures 104. In addition, each FET 100 further includes a pair of source/drain structures 106 in contact with its channel structure(s)

104 and located at opposite sides of its gate structure 102. The FETs 100 may be interconnected to form an integrated circuit by interconnections formed thereon (not shown). For instance, the integrated circuit may be a memory circuit, an input/output (I/O) type logic circuit or the like. It should be noted that, source/drain structure(s) may refer to a structure(s) of a source terminal or a drain terminal, individually or collectively dependent upon the context.

A plurality of the gate structures 102 may extend along a direction Y, and may be periodically arranged along a direction X intersecting with the direction Y. On the other hand, a plurality of the channel structures 104 may extend along the direction X, and may be separately arranged along the direction Y. As a result of such arrangement, the FETs 100 may be arranged as an array. In some embodiments, for those FETs 100 each defined at an intersection area of one gate structure 102 and a pair of channel structures 104, the channel structures 104 may be arranged by pairs. In these embodiments, a spacing between the channel structures 104 in each pair may be shorter than a spacing between adjacent pairs of channel structures 104.

For circuit design purpose, some of the gate structures 102 are respectively cut into separate sections by at least one gate isolation structure 108. For instance, the gate structures 102 shown in FIG. 1 are each separated into multiple sections by a plurality of the gate isolation structures 108. In those embodiments where the gate structures 102 extend along the direction Y and the channel structures 104 extend along the direction X, the gate isolation structures 108 may extend along the direction X. Further, in certain region where the channel structures 104 are arranged in pairs as shown in FIG. 1, the gate isolation structures 108 may respectively extend between adjacent pairs of the channel structures 104. As will be described in greater details, the gate isolation structures 108 are formed of an insulating material, and respectively formed in a wall shape.

Similarly, for circuit design purpose, some of the channel structures 104 are respectively cut into separate sections. Channel isolation structures 110 are used to cut these channel structures 104 into separate sections. In certain region where the channel structures 104 are arranged by pairs as shown in FIG. 1, some of the channel isolation structures 110 respectively extend through a single pair of the channel structures 104, while others of the channel isolation structures 110 may respectively extend through multiple pairs of the channel structures 104 (e.g., two pairs of the channel structures 104). In addition, in those embodiments where the gate isolation structures 108 are substantially parallel with the channel structures 104, an extending direction of the channel isolation structures 110 (e.g., the direction Y) may further intersect with an extending direction of the gate isolation structures 108 (e.g., the direction X). A channel structure 110 extending through a single pair of the channel structures 104 may be bounded between two gate isolation structures 108. In addition, a channel isolation structure 110 extending through multiple pairs of the channel structures 104 may cut the gate isolation structure(s) 108 between the pairs of the channel structures 104 into separate sections. Moreover, in some embodiments, the channel isolation structures 110 respectively take the place of a section of one of the gate structures 102, such that some of the gate structures 102 are further cut by the channel isolation structures 110. In these embodiments, the channel isolation structures 110 respectively extend between adjacent sections of a gate structure 102 along an extending direction of the gate structure 102 (e.g., the direction Y), and are substantially aligned with the sections of the gate structure 102. As will be described in greater details, the channel isolation structures 110 are formed of an insulating material, and respectively formed as a wall structure with protruding portions extending downwardly from a bottom surface of the wall structure.

Figure 2A:
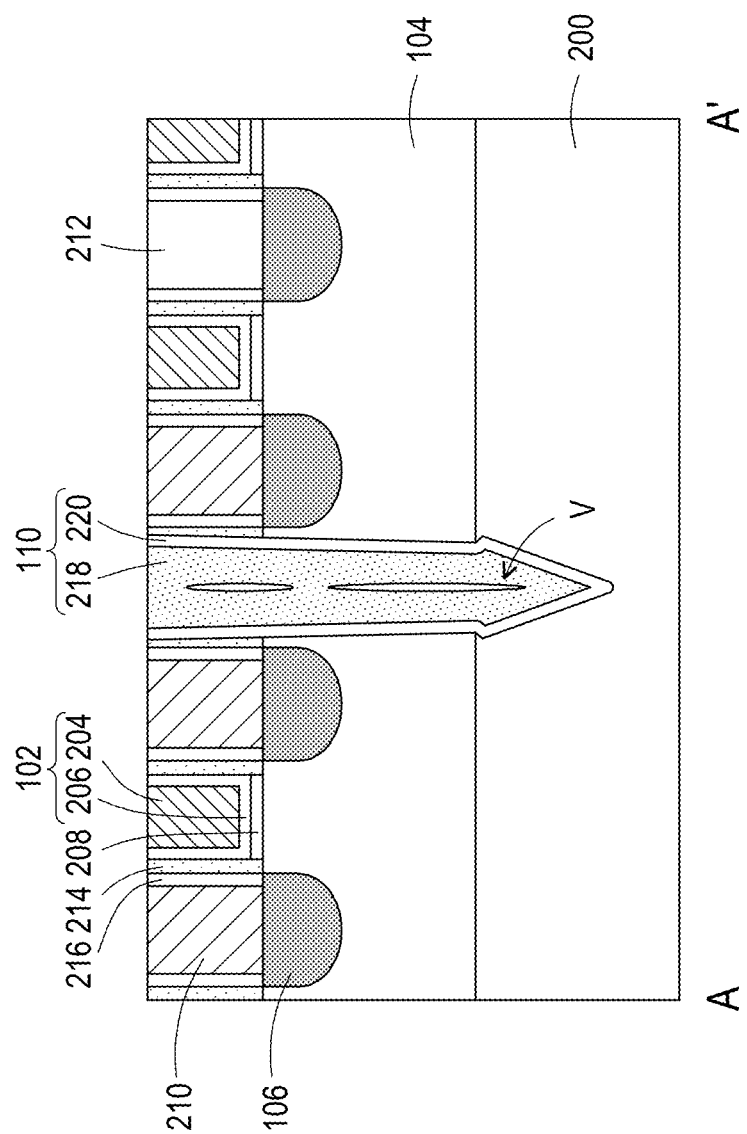
FIG. 2A is a schematic cross-sectional view along a channel structure intersected with a channel isolation structure, according to some embodiments of the present disclosure.
Figure 2B:
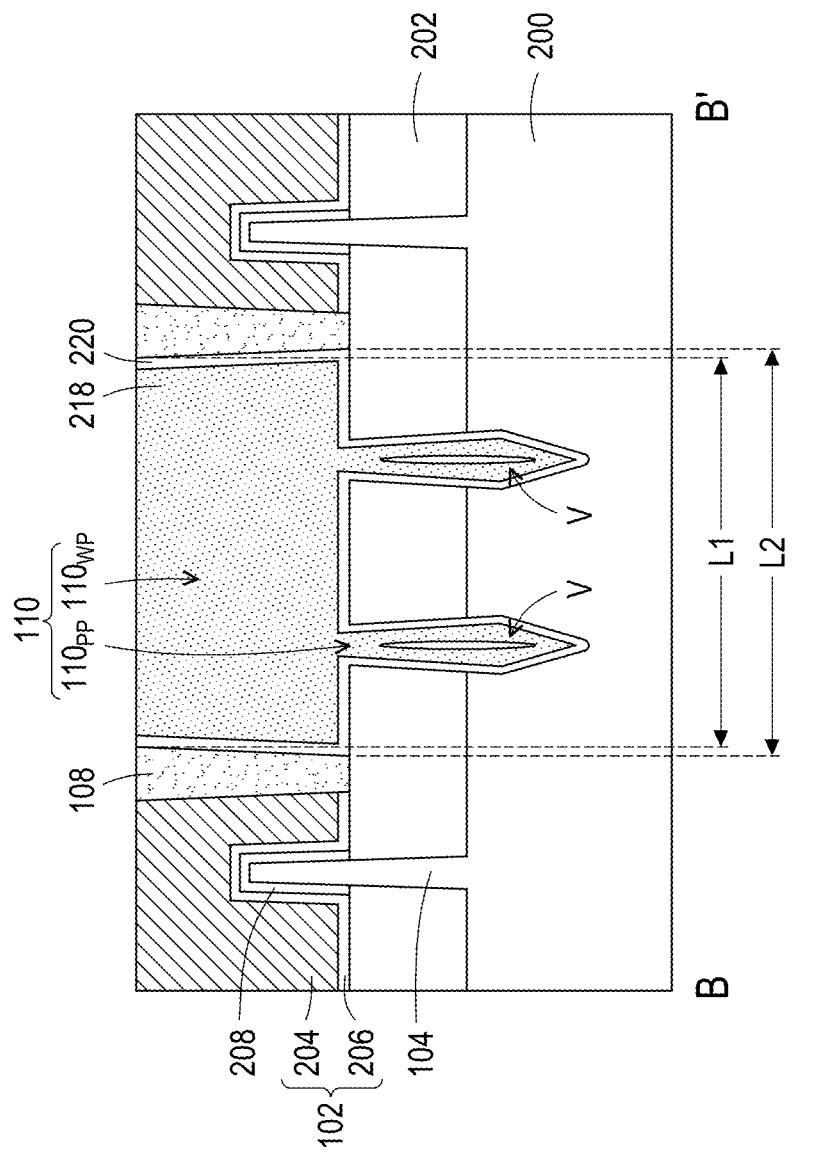
FIG. 2B is a schematic cross-sectional view illustrating a cross-section along channel isolation structure, according to these embodiments of the present disclosure.

FIG. 2A is a schematic cross-sectional view illustrating a cross-section along an A-A' line as shown in FIG. 1, according to some embodiments of the present disclosure. FIG. 2B is a schematic cross-sectional view illustrating a cross-section along a B-B' line shown in FIG. 1, according to these embodiments of the present disclosure. More details of the semiconductor device 10 are shown in FIG. 2A and FIG. 2B, while the semiconductor device 10 is only partially shown in FIG. 1.

Referring to FIG. 2A and FIG. 2B, the semiconductor device 10 is built on a substrate 200, such as a semiconductor wafer or a semiconductor-on-insulator (SOI) wafer. The channel structures 104 may be each formed in a fin shape. In some embodiments, the channel structures 104 are protruding portions of the substrate 200. In these embodiments, the substrate 200 and the channel structures 104 as a part of the substrate 200 include, for example, crystalline silicon. In alternative embodiments, the channel structures 104 external to the substrate 200 are formed on the substrate 200. In these alternative embodiments, for instance (but not limited to), the substrate 200 may include crystalline silicon, while the channel structures 104 may include a group III-V semiconductor material.

As indicated by FIG. 2B, bottom portions of the channel structures 104 are embedded in an isolation structure 202, so as to be in lateral contact with the isolation structure 202. On the other hand, upper portions of the channel structures 104 are protruded with respect to the isolation structure 202. The isolation structure 202 is formed of an insulating material, such as silicon oxide, silicon nitride, silicon oxynitride, the like or combinations thereof.

As also indicated by FIG. 2B, the upper portions of the channel structures 104 protrude into the gate structures 102 intersecting with the channel structures 104. As a result, a top surface and opposite sidewalls of the upper portion of each channel structure 104 are covered by the overlying gate structure 102, and bottom surfaces of the gate structures 102 may be recessed into the gate structures 102 in corresponding to the upper portions of the channel structures 104. On the other hand, since the bottom portions of the channel structures 104 are embedded in the isolation structure 202, the bottom portions of the channel structures 104 are spaced apart from the gate structures 102 at least through the isolation structure 202. In addition, the isolation structure 202 around the channel structures 104 may be partially covered by the gate structures 102.

According to some embodiments, each gate structure 102 includes a gate conductor 204 and a gate dielectric layer 206 lining along a bottom surface of the gate conductor 204, such that the gate conductor 204 can be capacitively coupled to the covered channel structure 104 through the gate dielectric layer 206 in between. As shown in FIG. 2B, a top surface and opposite sidewalls of the upper portion of each channel structure 104 may be conformally covered by the overlying gate dielectric layer 206. In addition, as shown in FIG. 2A, the gate dielectric layer 206 may further cover opposite sidewalls of the gate conductor 204. Although not shown, each gate structure 102 may further include one or more work function layer(s) extending in between the gate conductor 204 and the gate dielectric layer 206. Further, in some embodiments, the upper portions of the channel structures 104 are each conformally covered by an interfacial layer 208, so as to be separated from the overlying gate structure 102 by the interfacial layer 208, and adhesion between the channel structures 104 and the gate structures 102 may be improved by disposing the interfacial layers 208. In certain embodiments where the interfacial layers 208 are formed by using a selective formation process (e.g., a thermal oxidation process), the interfacial layers 208 may selectively cover the upper portions of the channel structures 104, while the isolation structure 202 may not be covered by the interfacial layers 208. As examples, a material of the gate conductor 204 may include W, TiN, TiAlC, Ru, Co, the like or combinations thereof; a material of the gate dielectric layer 206 may include a high-k dielectric material; and a material of the interfacial layer 208 may include silicon oxide.

Referring to FIG. 2A, in some embodiments, the source/drain structures 106 are formed in recesses of the channel structures 104 at opposite sides of each of the gate structures 102. The source/drain structures 106 may be epitaxial structures, and may be formed of silicon germanium, silicon carbide, silicon phosphide or the like. Although the source/drain structures 106 shown in FIG. 2A are depicted as being fully embedded in the channel structures 104, the source/drain structures 106 may actually protrude from top surfaces of the channel structures 104, such that adjacent source/drain structures 106 may connect to form patterns as shown in FIG. 1.

Further, as also shown in FIG. 2A, conductive contacts 210 may be formed on some of the source/drain structures 106, to connect these source/drain structures 106 to overlying interconnections (not shown). The conductive contacts 210 may be formed through a dielectric layer 212 (partially shown) covering the source/drain structures 106 and laterally surrounding the gate structures 102. In addition, gate spacers 214 are formed along sidewalls of the gate structures 102, such that the conductive contacts 210 are in lateral contact with adjacent gate structures 102 through the gate spacers 214 in between, and a proper isolation between the gate structures 102 and the conductive contacts 210 can be provided by the gate spacers 214. Each of the gate spacers 214 may be a single layer or a multilayer structure. In some embodiments, etching stop layers 216 may respectively remained on outer surfaces of the gate spacers 214, such that the gate spacers 214 are respectively located between a gate structure 102 and a covering etching stop layer 216.

As examples, the conductive contacts 210 may be formed of W, Ru, Co, the like or combinations thereof; the dielectric layer 212 may be formed of silicon oxide, SiOC, SiOCN, silicon nitride, the like or combinations thereof; the gate spacers 214 may be formed of SiOC, SiOCN, SiCN, the like or combinations thereof; and the etching stop layers 216 may be formed of SiOC, SiOCN, SiCN, silicon nitride, the like or combinations thereof.

As shown in FIG. 2B, one of the gate structures 102 is laterally penetrated through by multiple ones of the gate isolation structures 108 (only two of these gate isolation structures 108 are shown). In addition to laterally extending through the gate structure 102, the gate isolation structures 108 may extend through the gate structure 102 along a vertical direction, such that each of the gate isolation structure 108 is in lateral contact with one or two of discrete section(s) of the gate structure 102. As such, the gate isolation structures 108 are each in lateral contact with the gate conductor 204 and the gate dielectric layer 206 of one or more discrete section(s) of a gate structure 102. In some embodiments, the gate isolation structures 108 are in contact with the gate conductors 204 without the gate dielectric layers 206 extending in between. Moreover, in some embodiments, the gate isolation structures 108 stand on the isolation structure 202, and are formed to a height substantially leveled with top surfaces of the gate structures 102, and over top surfaces of the channel structures 104. The gate isolation structures 108 are formed of an insulating material. For instance, the gate isolation structures 108 may be formed of SiCN, silicon nitride, silicon oxide, SiOC, SiOCN, the like or combinations thereof.

Referring to FIG. 2A and FIG. 2B, one of the channel isolation structures 110 is shown. As shown in FIG. 2A, a channel structure 104 is cut into separate sections by the channel isolation structure 110. The channel isolation structure 110 may extend into the substrate 200 from above the channel structure 104, and the channel structure 104 is penetrated through by the channel isolation structure 110. As indicated by FIG. 1, a section of one of the gate structures 102 is taken place by the channel isolation structure 110. Consequently, as shown in FIG. 1 and FIG. 2A, the channel isolation structure 110 is located between a pair of the source/drain structures 106 used to be located at opposite sides of the section of the gate structure 102, and may be located between portions of the gate spacers 214 and the etching stop layers 216 used to cover sidewalls of the section of the gate structure 102. As an example shown in FIG. 2A, a pair of the conductive contacts 210 may stand on the source/drain structures 106 at opposite sides of the channel isolation structure 110, and the channel isolation structure 110 may be in lateral contact with these conductive contacts 210 through the portions of the gate spacers 214 and the etching stop layers 216. Although not shown, the channel isolation structure 110 may be further in lateral contact with the dielectric layer 212 surrounding the conductive contacts 210, and the portions of the gate spacers 214 and the etching stop layers 216 may extend in between the channel isolation structure 110 and the dielectric layer 212. Further, another channel isolation structure 110 (not shown) may be in lateral contact with a conductive contact 210 by a single side, and yet another channel isolation structure 110 (also not shown) located between source/drain structures 106 not being routed by any of the conductive contacts 210 may be sandwiched between portions of the dielectric layer 212. In some embodiments, top ends of the channel isolation structures 110 are substantially coplanar with top ends of the gate structures 102, the conductive contacts 210 and the dielectric layer 212. In those embodiments where the gate structures 102 are laterally covered by the gate spacers 214 and the etching stop layers 216, the top ends of the channel isolation structures 110 may be substantially coplanar with top ends of the gate spacers 214 and the etching stop layers 216 as well.

As shown in FIG. 2B, the channel isolation structure 110, which takes the place of a section of the gate structure 102, may extend between the gate isolation structures 108 laterally cutting through the gate structure 102. Further, the channel isolation structure 110 may further take the place of sections of the channel structures 104 used to be covered by the replaced section of the gate structure 102, and may further extend into the substrate 200. As a result, a wall portion $110_{WP}$ of the channel isolation structure 110 replacing the section of the gate structure 102 and the upper portions of the sections of the channel structures 104 is located on the isolation structure 202, and extends between two gate isolation structures 108. In addition, protruding portions $110_{PP}$ of the channel isolation structure 110 replacing the lower portions of the sections of the channel structures 104 penetrate through the isolation structure 202, and further extend downwardly into the substrate 200. As an example, the channel isolation structure 110 shown in FIG. 2B has a wall portion $110_{WP}$ and two separate protruding portions $110_{PP}$ extending from a bottom end of the wall portion $110_{WP}$. Although not shown, another channel isolation structure 110 may include a wall portion $110_{WP}$ and a single protruding portion $110_{PP}$ or more than two protruding portions $110_{PP}$ extending downwardly from a bottom end of the wall portion $110_{WP}$. In those embodiments where the gate isolation structures 108 taper downwardly, the wall portion $110_{WP}$ of a channel isolation structure 110 extending in between may have a top length L1 shorter than a bottom length L2. On the other hand, an upper part of a protruding portion $110_{PP}$ of a channel isolation structure 110 may be substantially identical with the lower portion of the replaced channel structure 104, and a lower part of the protruding portion $110_{PP}$ may laterally expand and then narrow down along a direction away from the upper part of the protruding portion $110_{PP}$.

As shown in FIG. 2A and FIG. 2B, in some embodiments, the channel isolation structures 110 respectively include a low-k dielectric material 218 formed of boron nitride. In some embodiments, a dielectric constant (k) of the low-k dielectric material 218 ranges from about 1.9 to about 4.5. In these embodiments, an atomic ratio of boron over nitrogen in the low-k dielectric material 218 may be close to and slightly greater than 1. For instance, the atomic ratio of boron over nitrogen in the low-k dielectric material 218 may range from about 1.0 to about 1.2. As compared to a channel isolation structure made of silicon nitride (with a dielectric constant about 7), the channel isolation structure 110 according to embodiments of the present disclosure has a much smaller dielectric constant, thus may result in much less resistance-capacitance (RC) delay. For instance, as shown in FIG. 2A, a parasitic capacitor may be inevitably formed between a pair of the conductive contacts 210 at opposite sides of the channel isolation structure 110. Since the channel isolation structure 110 is formed with low dielectric constant, a capacitance of the parasitic capacitor can be significantly reduced, and RC delay caused by the parasitic capacitor can be lowered. On the other hand, as compared to other low-k dielectric materials such as a porous material, boron nitride is much denser, thus have a significantly greater mechanical strength.

According to some embodiments, a method for forming the low-k dielectric material 218 includes an atomic layer deposition (ALD) process, and a first precursor that contains boron as well as a second precursor that contains nitrogen are used in the ALD process. In these embodiments, the low-k dielectric material 218 may be formed with a dielectric constant ranging from about 3.5 to about 4.5. In addition, in these embodiments, voids V may be sealed in the low-k dielectric material 218. In alternative embodiments, a method for forming the low-k dielectric material 218 includes an ALD process or multiple cycles each including a chemical vapor deposition (CVD) process and a following etching process, and a precursor containing both of boron and nitrogen is used in the ALD or each CVD process. In these alternative embodiments, the low-k dielectric material 218 may be formed with a dielectric constant lower than a dielectric constant of the low-k dielectric material 218 formed by an ALD process using a boron containing precursor and a nitrogen containing precursor. For instance, in these alternative embodiments, the dielectric constant of the low-k dielectric material 218 may range from about 1.9 to about 2.5. In addition, in these alternative embodiments, the low-k dielectric material 218 may be formed with or without the voids V.

In addition to the low-k dielectric material 218, the channel isolation structures 110 may each further include an insulating liner 220. The insulating liner 220 wraps around the low-k dielectric material 218, and underlines the low-k dielectric material 218. The insulating liner 220 may be configured to improve adhesion between the low-k dielectric material 218 and surrounding components, and/or to prevent inter-diffusion between the low-k dielectric material 218 and the surrounding components. In some embodiments, except for a top surface, the low-k dielectric material 218 is entirely covered by the insulating liner 220. The insulating liner 220 is formed of an insulating material, such as silicon oxide.

Figure 3:
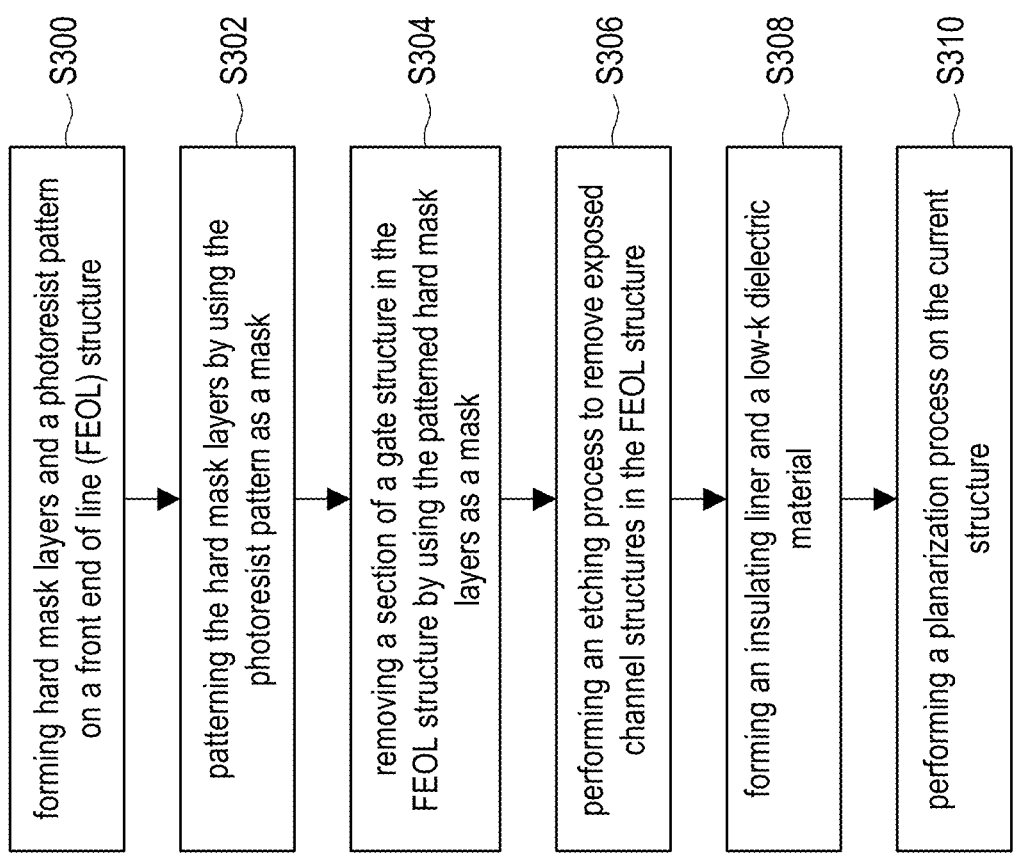
FIG. 3 is a flow diagram illustrating a process for forming a channel isolation structure, according to some embodiments of the present disclosure.

FIG. 3 is a flow diagram illustrating a process for forming the channel isolation structure 110 as shown in FIG. 2A and FIG. 2B, according to some embodiments of the present disclosure. FIG. 4A, FIG. 4C, FIG. 4E, FIG. 4G and FIG. 4I are schematic cross-sectional views illustrating structures along the A-A' line at various intermediate stages of the process as shown in FIG. 3. FIG. 4B, FIG. 4D, FIG. 4F, FIG. 4H and FIG. 4J are schematic cross-sectional views illustrating structures along the B-B' line at the intermediate stages of the process as shown in FIG. 3.

Prior to an intermediate stage as shown in FIG. 4A and FIG. 4B, the gate structures 102, the channel structures 104, the source/drain structures 106, the conductive contacts 210, the dielectric layer 212, the gate isolation structures 108 as well as the interfacial layer 208, the gate spacers 214 and the etching stop layers 216 may have been formed. In the current intermediate stage, a step S300 is performed, and a stack of hard mask layers 400a-400e as well as a photoresist pattern 402 are formed over the previously built structure. The hard mask layers 400a-400e are formed in order. According to some embodiments, the hard mask layer 400a is formed of silicon nitride; the hard mask layer 400b is formed of silicon; the hard mask layer 400c is formed of silicon nitride; the hard mask layer 400d is formed of silicon oxide; and the hard mask layer 400e is formed of silicon nitride. In addition, in some embodiments, the hard mask layers 400a-400e are respectively formed by a deposition process, such as a CVD process. On the other hand, the photoresist pattern 402 formed over the hard mask layers 400a-400e has an opening $W_{402}$ penetrating through the photoresist pattern 402. In some embodiments, the photoresist pattern 402 is a single layer or a multilayer structure. A method for forming the photoresist pattern 402 may include at least one coating process and at least one lithography process. In the following step, the hard mask layers 400a-400e may be patterned by removing portions of the hard mask layers 400a-400e overlapped with the opening $W_{402}$.

Figures 4C, 4D:
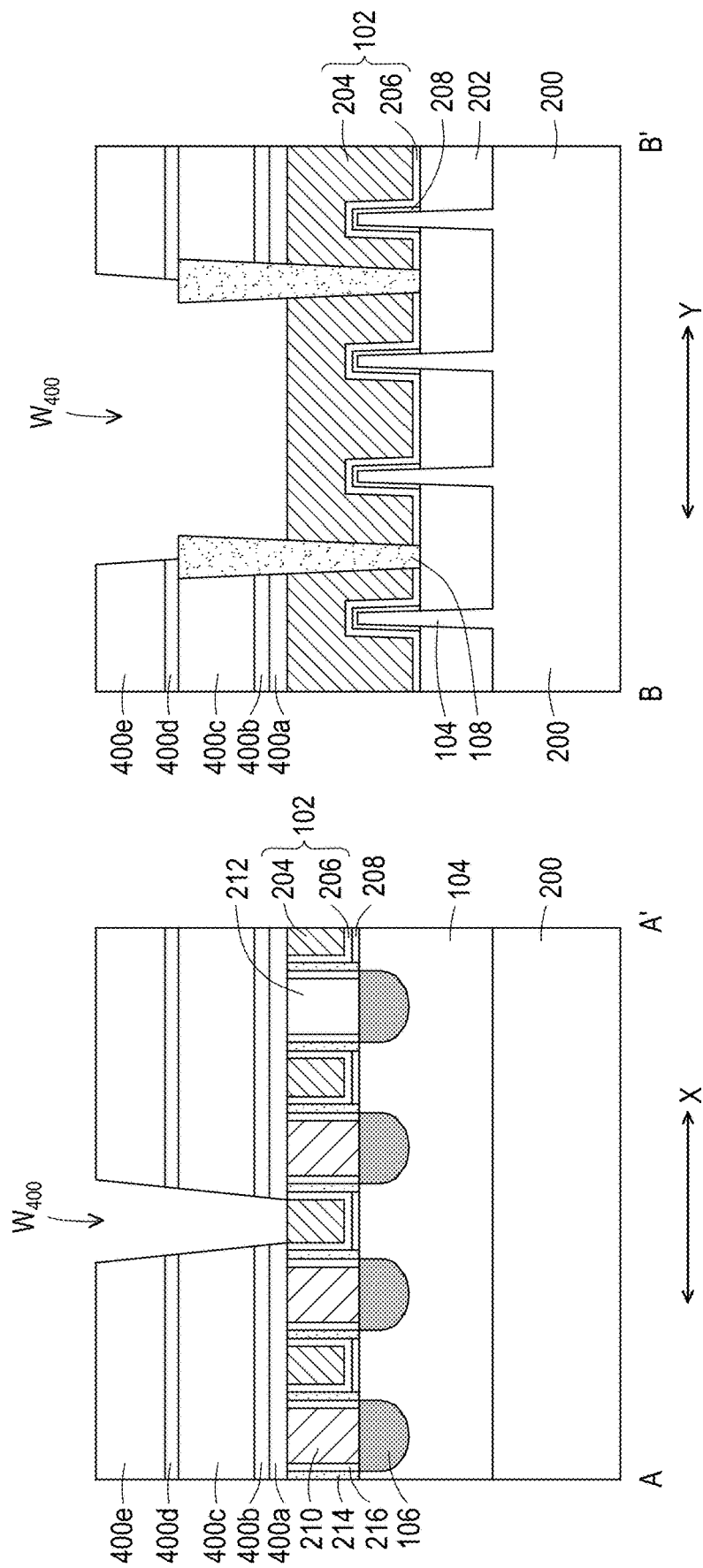

Referring to FIG. 3, FIG. 4C and FIG. 4D, step S302 is performed, and the hard mask layers 400a-400e are patterned by using the photoresist pattern 402 as a mask. Portions of the hard mask layers 400a-400e overlapped with the opening $W_{402}$ of the photoresist pattern 402 are removed, while portions of the hard mask layers 400a-400e covered by the photoresist pattern 402 remain. By partially removing the hard mask layers 400a-400e, a section of an underlying gate structure 102 is exposed, and will be removed in a following step. One or more etching process(es) may be used for patterning the hard mask layers 400a-400e. In some embodiments, as shown in FIG. 4D, gate isolation structures 108 partially exposed in an opening $W_{400}$ extending through the hard mask layers 400a-400e have sufficient etching selectivity with respect to the hard mask layers 400a-400e, thus may be barely etched during patterning of the hard mask layers 400a-400e. After patterning the hard mask layers 400a-400e, the photoresist pattern 402 may be removed by, for example, a stripping process or an ashing process.

Referring to FIG. 3, FIG. 4E and FIG. 4F, step S304 is performed, and a section of the gate structure 102 overlapped with the opening $W_{400}$ is removed, and an opening $W_{102}$ is formed in the gate structure 102. Due to etching selectivity, portions of the channel structures 104 previously covered by the section of such gate structure 102 may not be removed during formation of the opening $W_{102}$. In other words, the portions of the channel structures 104 are currently exposed in the opening WM. In a following step, the portions of the channel structures 104 will be removed. In some embodiments, as shown in FIG. 4E, portions of the gate spacers 214 and the etching stop layers 216 previously lining along the section of the gate structure 102 may not be subjected to removal, and thus are remained at opposite sides of the opening $W_{102}$. In some embodiments, as shown in FIG. 4F, the gate isolation structures 108 at opposite sides of the section of the gate structure 102 and portions of the isolation structure 202 lying below the section of the gate structure 102 may not be removed away in the current step, thus these gate isolation structures 108 are remained at opposite sides of the opening $W_{102}$, and the exposed portions of the channel structures 104 are still in lateral contact with the isolation structure 202. An etching process may be used for forming the opening $W_{102}$.

Referring to FIG. 3, FIG. 4G and FIG. 4H, a step S306 is performed, and a further etching process is performed. As a result, the portions of the channel structures 104 overlapped with the openings $W_{400}$, $W_{102}$ are etched away to form openings $W_{104}$, and these channel structures 104 are respectively cut into separate sections, as shown in FIG. 4G. As shown in FIG. 4H, the openings $W_{104}$ penetrate through the isolation structure 202. According to some embodiments, the openings $W_{104}$ further extends into the substrate 200. In addition, in some embodiments, the hard mask layers 400d, 400e above the gate isolation structures 108 are removed during formation of the openings $W_{104}$. The openings $W_{400}$, $W_{102}$, $W_{104}$ collectively define a space (e.g., a cavity) for accommodating the channel isolation structure 110 to be formed in a following steps.

Referring to FIG. 3, FIG. 4I and FIG. 4J, a step S308 is performed, and an insulating liner 404 as well as a low-k dielectric material 406 are formed in the space collectively defined by the openings $W_{400}$, $W_{102}$, $W_{104}$. The insulating liner 404 and the low-k dielectric material 406 will be planarized to form the insulating liner 220 and the low-k dielectric material 218 as described with reference to FIG. 2A and FIG. 2B, respectively. In the current step, the insulating liner 404 may conformally cover the structure as shown in FIG. 4G and FIG. 4H. The low-k dielectric material 406 fills up the openings $W_{400}$, $W_{102}$, $W_{104}$, and may span over the hard mask layers 400a-400c and the gate isolation structures 108. The insulating liner 404 is formed of an insulating material, such as silicon oxide. In some embodiments, a method for forming the insulating liner 404 includes a deposition process, such as an ALD process. On the other hand, the low-k dielectric material 406 is formed of boron nitride. In some embodiments, the low-k dielectric material 406 is formed by using an ALD process, and a first precursor containing boron as well as a second precursor containing nitrogen are used in the ALD process. In these embodiments, the voids V may be sealed in the low-k dielectric material 406. In alternative embodiments, the low-k dielectric material 406 is formed by an ALD process or by performing multiple cycles each including a CVD process and a following etching process, and a precursor containing both of boron and nitrogen is used in the ALD or each CVD process.

Referring to FIG. 3, FIG. 2A and FIG. 2B, a step S310 is performed, and a planarization process is performed on the current structure. In some embodiments, the planarization process is performed until top surfaces of the gate structures 102, the conductive contacts 210 and the dielectric layer 212 are exposed. In these embodiments, a portion of the insulating liner 404 above the gate structures 102, the conductive contacts 210 and the dielectric layer 212 are removed, and remained portion of the insulating liner 404 forms the insulting liner 220 as described with reference to FIG. 2A and FIG. 2B. In addition, a portion of the low-k dielectric material 406 above the gate structures 102, the conductive contacts 210 and the dielectric layer 212 are removed, and remained portion of the low-k dielectric material 406 forms the low-k dielectric material 218 as described with reference to FIG. 2A and FIG. 2B. Further, the hard mask layers 400a-400c as well as portions of the gate isolation structures 108 above the gate structures 102, the conductive contacts 210 and the dielectric layer 212 may be removed as well. As examples, the planarization process may include a polishing process, an etching process or a combination thereof.

Up to here, the structure as shown in FIG. 2A and FIG. 2B has been formed. Although only the formation of a single channel isolation structure 110 is described, others of the channel isolation structures 110 may be formed in the same way, and all of the channel isolation structures 110 may be formed simultaneously. Furthermore, more back-end-of-line (BEOL) processes may be further performed for providing local and global interconnections for the FETs 100.

Figure 5B:
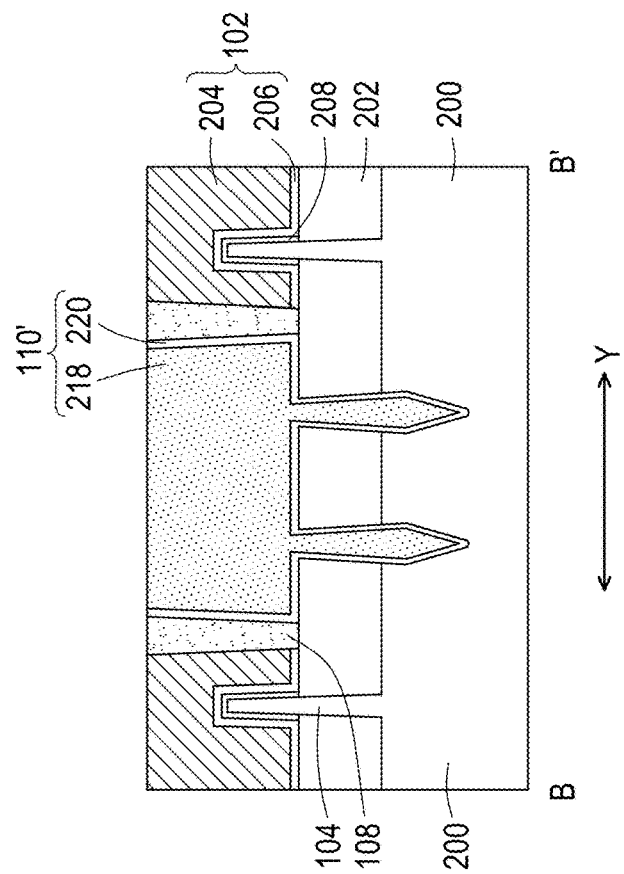
FIG. 5B is a schematic cross-sectional view illustrating a cross-section along the channel isolation structure shown in FIG. 5A, according to some embodiments in the present disclosure.
Figure 5A:
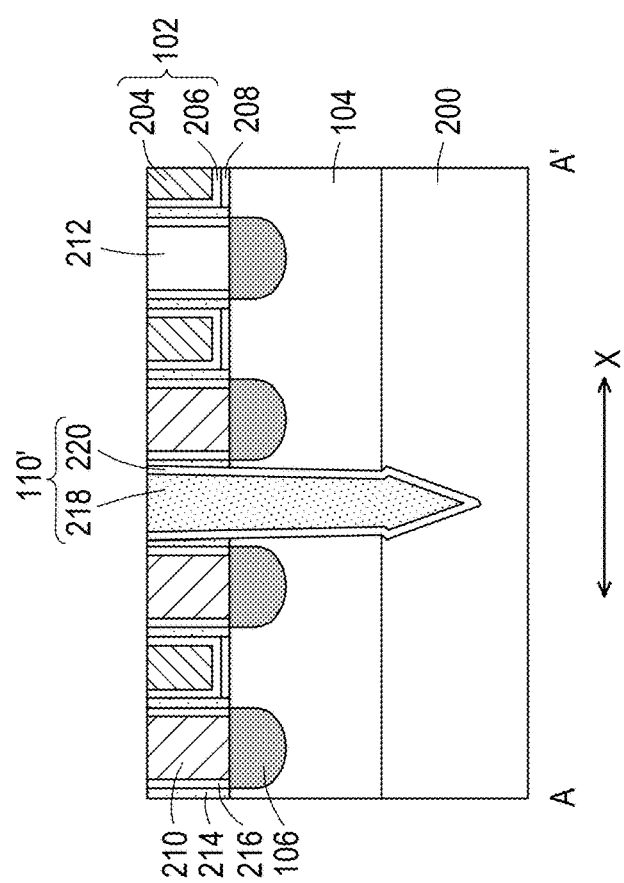
FIG. 5A is a schematic cross-sectional view illustrating a cross-section along a channel structure intersected with a channel isolation structure, according to some embodiments of the present disclosure.

FIG. 5A is a schematic cross-sectional view illustrating a cross-section along an A-A' line as shown in FIG. 1, according to some embodiments of the present disclosure. FIG. 5B is a schematic cross-sectional view illustrating a cross-section along a B-B' line shown in FIG. 1, according to these embodiments in the present disclosure.

A channel isolation structure 110' shown in FIG. 5A and FIG. 5B is similar to the channel isolation structure 110 as described with reference to FIG. 2A and FIG. 2B, except that voids may be absent in the low-k dielectric material 218 of the channel isolation structure 110'. In regarding manufacturing, an initial insulating liner and an initial low-k dielectric material may be formed and then planarized to form the channel isolation structure 110', as similar to a process described with reference to FIG. 4I, FIG. 4J and FIG. 2A, FIG. 2B. As a difference from the afore-mentioned process, such initial low-k dielectric material may be formed by using a flowable CVD process using a precursor containing both of boron and nitrogen. As a result, the low-k dielectric material 218 may be formed with a dielectric constant ranging from about 1.9 to about 2.5.

Other structural and process details of the embodiments as shown in FIG. 5A and FIG. are similar to those of the embodiments described with reference to FIG. 2A, FIG. 2B, FIG. 3 and FIG. 4A through FIG. 4H, thus are not repeated again.

FIG. 6A is a schematic cross-sectional view illustrating a cross-section along an A-A' line as shown in FIG. 1, according to some embodiments of the present disclosure. FIG. 6B is a schematic cross-sectional view illustrating a cross-section along a B-B' line shown in FIG. 1, according to these embodiments in the present disclosure.

A channel isolation structure 610 shown in FIG. 6A and FIG. 6B is similar to the channel isolation structure 110 as described with reference to FIG. 2A and FIG. 2B, except that the channel isolation structure 610 may not include an insulating liner. In regarding manufacturing, formation of an initial insulating liner and planarizing the initial insulating liner can be omitted. In addition, the voids V may be sealed in the low-k dielectric material 218 when an initial low-k dielectric material to be planarized to form the low-k dielectric material 218 is formed by performing an ALD process using a boron containing precursor and a nitrogen containing precursor, or by performing multiple cycles each including a CVD process using a precursor containing both of boron and nitrogen and an etching process following the CVD process. Alternatively, the voids V may be absent when the initial low-k dielectric material is formed by a flowable CVD process using a precursor containing both of boron and nitrogen.

Other structural and process details of the embodiments as shown in FIG. 6A and FIG. 6B are similar to those of the embodiments described with reference to FIG. 2A, FIG. 2B, FIG. 3 and FIG. 4A through FIG. 4H, thus are not repeated again.

Figures 7A, 7B:
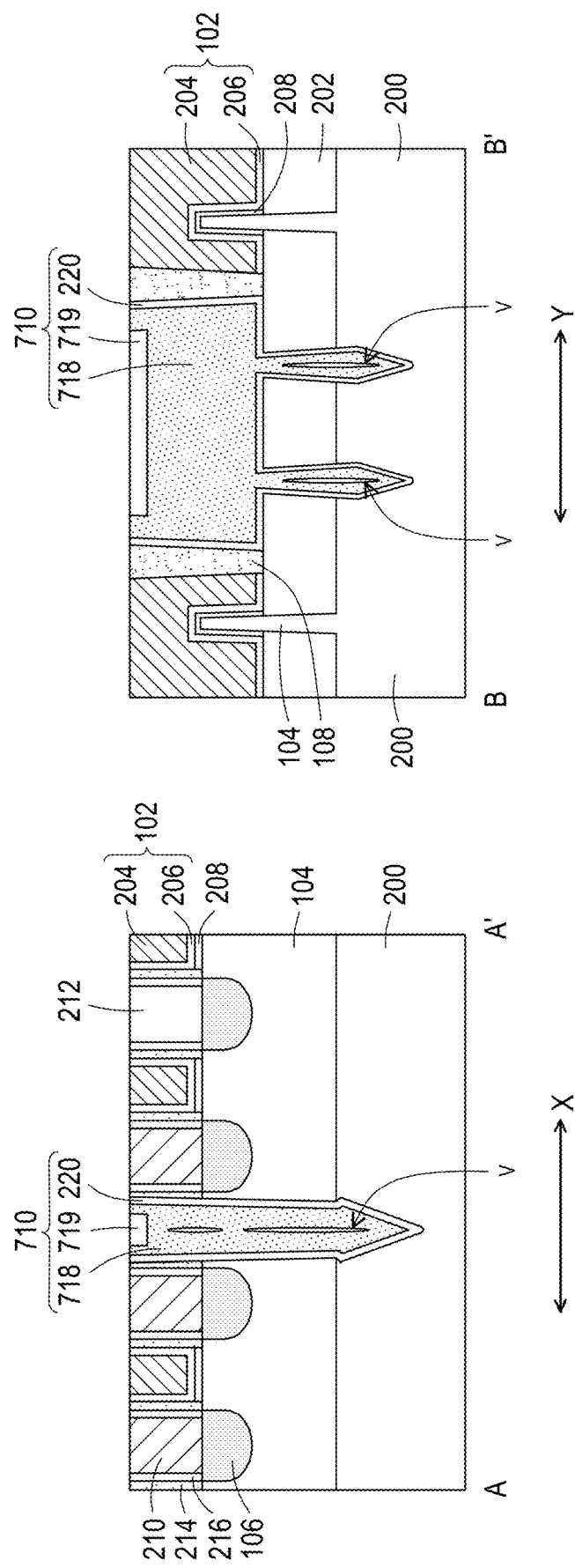
FIG. 7A is a schematic cross-sectional view illustrating a cross-section along a channel structure intersected with a channel isolation structure, according to some embodiments of the present disclosure.
FIG. 7B is a schematic cross-sectional view illustrating a cross-section along the channel isolation structure as shown in FIG. 7A, according to some embodiments in the present disclosure.

FIG. 7A is a schematic cross-sectional view illustrating a cross-section along an A-A' line as shown in FIG. 1, according to some embodiments of the present disclosure. FIG. 7B is a schematic cross-sectional view illustrating a cross-section along a B-B' line shown in FIG. 1, according to these embodiments in the present disclosure.

As similar to the channel isolation structure 110 described with reference to FIG. 2A and FIG. 2B, a channel isolation structure 710 shown in FIG. 7A and FIG. 7B includes a low-k dielectric material 718 and an insulating liner 220 wrapping around and underlining the low-k dielectric material 718. The low-k dielectric material 718, as identical with the low-k dielectric material 118 shown in FIG. 2A and FIG. 2B in terms of material, is formed of boron nitride. As a difference from the channel isolation structure 110 described with reference to FIG. 2A and FIG. 2B, the channel isolation structure 710 shown in FIG. 7A and FIG. 7B further includes a capping layer 719 formed in a recess defined by a top portion of the low-k dielectric material 718. A boundary of the recess is close to a boundary of the low-k dielectric material 718, such that most of the low-k dielectric material 718 is covered by the capping layer 719, and the capping layer 719 is laterally surrounded by a thin portion of the low-k dielectric material 718. The capping layer 719 is configured to prevent the low-k dielectric material 718 from oxidation or other possible damages. In some embodiments, the capping layer 719 is formed of silicon nitride. In some embodiments, a ratio of a thickness of the capping layer 719 over a total thickness of the channel isolation structure 710 ranges from about 0.2 to about 0.8. Further, in some embodiments, a top surface of the capping layer 719 is substantially coplanar with topmost ends of the low-k dielectric material 718 and the insulating liner 220.

In regarding manufacturing of the channel isolation structure 710, an initial insulating liner and an initial low-k dielectric material may be formed in a cavity as shown in FIG. 4G and FIG. 4H, and an initial capping layer is filled in a recess at a top portion of the initial low-k dielectric material. Subsequently, the initial insulating layer, the initial low-k dielectric material and the initial capping layer are planarized to form the insulating layer 220, the low-k dielectric material 718 and the capping layer 719 of the channel isolation structure 710, respectively. In some embodiments, a method for forming the initial low-k dielectric material with the recess includes performing cycles each including a CVD process and a following etching process, and a precursor containing both of boron and nitrogen may be used in each of the CVD processes. In certain cases, voids V may be sealed in the initial low-k dielectric material, and remain in the eventually formed low-k dielectric material 718. In addition, in some embodiments, the initial capping layer is formed by a CVD process.

Other structural and process details of the embodiments as shown in FIG. 7A and FIG. 7B are similar to those of the embodiments described with reference to FIG. 2A, FIG. 2B, FIG. 3 and FIG. 4A through FIG. 4H, thus are not repeated again.

Figures 8A, 8B:
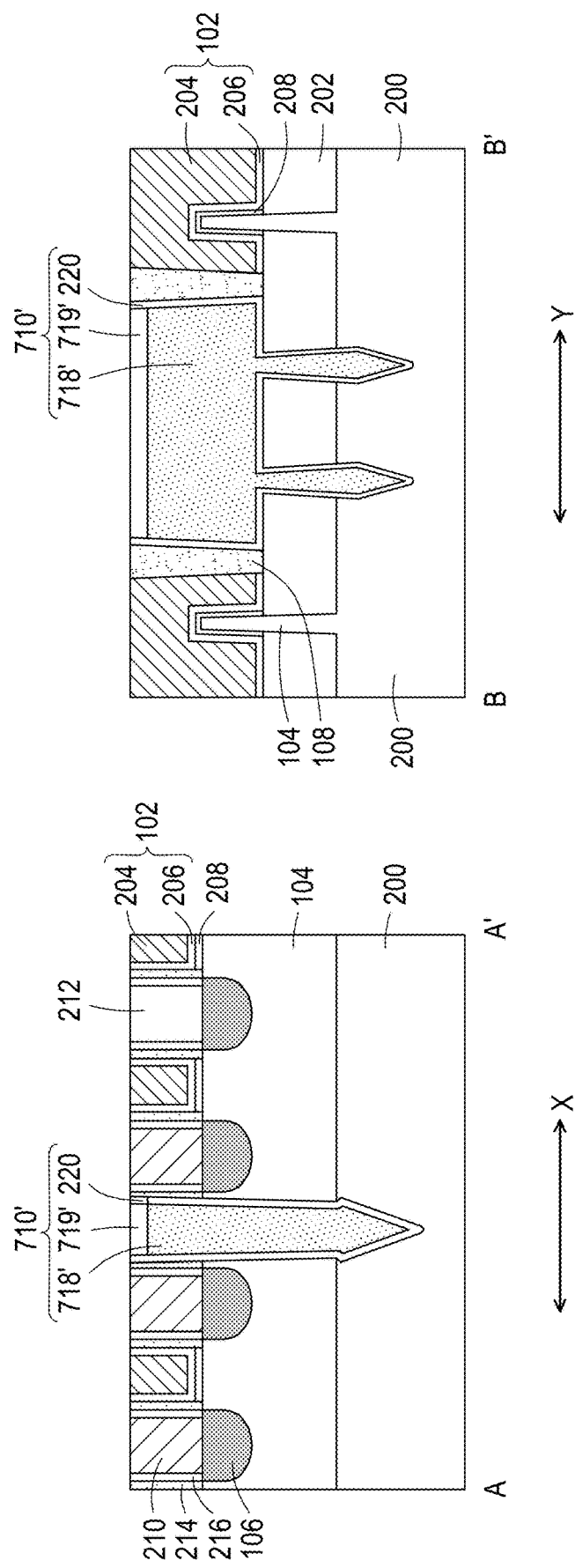
FIG. 8A is a schematic cross-sectional view illustrating a cross-section along a channel structure intersected with a channel isolation structure, according to some embodiments of the present disclosure.
FIG. 8B is a schematic cross-sectional view illustrating a cross-section along the channel isolation structure as shown in FIG. 8A, according to some embodiments in the present disclosure.

FIG. 8A is a schematic cross-sectional view illustrating a cross-section along an A-A' line as shown in FIG. 1, according to some embodiments of the present disclosure. FIG. 8B is a schematic cross-sectional view illustrating a cross-section along a B-B' line shown in FIG. 1, according to these embodiments in the present disclosure.

A channel isolation structure 710' as shown in FIG. 8A and FIG. 8B is similar to the channel isolation structure 710 described with reference to FIG. 7A and FIG. 7B, that includes a capping layer 719' covering a low-k dielectric material 718' formed of boron nitride. As a difference from the low-k dielectric material 718 and the capping layer 719 shown in FIG. 7A and FIG. 7B, the capping layer 719' may cover an entire top surface of the low-k dielectric material 718'. The top surface of the low-k dielectric material 718' may be lower than a topmost end of the insulating liner 220 wrapping around and underlining the low-k dielectric material 718', and entirely covered by the capping layer 719'. In some embodiments, a top surface of the capping layer 719' is substantially coplanar with the topmost end of the insulating liner 220. As being entirely covered by the capping layer 719, the low-k dielectric material 718' may be better protected from oxidation or other possible damages. In some embodiments, the capping layer 719' is formed of silicon nitride.

In regarding manufacturing of the channel isolation structure 710', an initial insulating liner and an initial low-k dielectric material may be formed in a cavity as shown in FIG. 4G and FIG. 4H at first. The initial low-k dielectric material may be formed to a height lower than a topmost end of the cavity. Afterwards, an initial capping layer is formed on the initial low-k dielectric material. Subsequently, the initial insulating layer, the initial low-k dielectric material and the initial capping layer are planarized to form the insulating layer 220, the low-k dielectric material 718' and the capping layer 719' of the channel isolation structure 710', respectively. In some embodiments, the initial low-k dielectric material is formed by performing a flowable CVD process, and a precursor containing both of boron and nitrogen may be used in each of the CVD processes. In these embodiments, voids may be absent in the initial low-k dielectric material and the eventually formed low-k dielectric material 718'. In addition, in some embodiments, the initial capping layer is formed by a CVD process.

Other structural and process details of the embodiments as shown in FIG. 8A and FIG. 8B are similar to those of the embodiments described with reference to FIG. 2A, FIG. 2B, FIG. 3 and FIG. 4A through FIG. 4H, thus are not repeated again.

As above, various embodiments of the present disclosure provides a channel isolation structure for cutting a channel structure into separate sections is provided. The channel isolation structure is formed with a low dielectric constant, such that a possible parasitic capacitor defined across the channel isolation structure can have a lower capacitance. Consequently, RC delay resulted from the parasitic capacitance can be effectively limited. A low-k dielectric material in the channel isolation structure includes boron nitride. According to some embodiments, the channel isolation structure further includes an insulating liner wrapping around and underlining the low-k dielectric material. In further embodiments, the channel isolation structure further includes a capping layer covering the low-k dielectric material and preventing the low-k dielectric material from oxidation and other possible damages.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In an aspect of the present disclosure, a semiconductor device is provided. The semiconductor device comprises: channel structures, laterally extending on a substrate; gate structures, intersecting and covering the channel structures; and a channel isolation structure, laterally penetrating through at least one of the channel structures, and extending between separate sections of one of the gate structures along an extending direction of the one of the gate structures, wherein a low-k dielectric material in the channel isolation structure comprises boron nitride.

In another aspect of the present disclosure, a semiconductor device is provided. The semiconductor device comprises: a channel structure, protruded from an isolation structure formed on a substrate, and extending along a first direction; a channel isolation structure, extending between two separate sections of the channel structure along a second direction, wherein a wall portion of the channel isolation structure is located on the isolation structure, a protruding portion of the channel isolation structure extends into the substrate through the isolation structure, and a low-k dielectric material in the channel isolation structure comprises boron nitride; and a gate structure, extending on the isolation structure along the second direction, and having two separate sections at opposite sides of the channel isolation structure and aligned with the channel isolation structure.

In yet another aspect of the present disclosure, a method for forming a semiconductor device is provided. The method comprises: forming channel structures on a substrate; forming gate structures on the substrate, such that the gate structure intersects and covers the channel structures; removing a section of one of the gate structures, to expose a section of one of the channel structures; removing the section of the one of the channel structures; and forming a channel isolation structure to take place of the section of the one of the channel structures and the section of the one of the gate structures, wherein a low-k dielectric material in the channel isolation structure comprises boron nitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   channel structures, laterally extending on a substrate;
   gate structures, intersecting and covering the channel structures; and
   a channel isolation structure, laterally penetrating through at least one of the channel structures, and extending between separate sections of one of the gate structures along an extending direction of the one of the gate structures, wherein a low-k dielectric material in the channel isolation structure comprises boron nitride.

2. The semiconductor device according to claim 1, further comprising:
   pairs of source/drain structures, in contact with the channel structures, wherein each pair of the source/drain structures are disposed at opposite sides of one of the gate structures, and the channel isolation structure extends between one of the pairs of the source/drain structures.

3. The semiconductor device according to claim 1, further comprising:
   gate spacers, covering sidewalls of the gate structures, wherein the channel isolation structure extends between two of the gate spacers extending along the one of the gate structures.

4. The semiconductor device according to claim 3, further comprising:
   etching stop layers, in lateral contact with the gate structures through the gate spacers, wherein the channel isolation structure extends between two of the etching stop layers extending along the one of the gate structures.

5. The semiconductor device according to claim 1, wherein the channel isolation structure further extends into the substrate.

6. The semiconductor device according to claim 1, wherein a top surface of the channel isolation structure is substantially coplanar with top surfaces of the gate structures.

7. The semiconductor device according to claim 1, wherein a void is sealed in the low-k dielectric material of the channel isolation structure.

8. The semiconductor device according to claim 1, wherein the channel isolation structure further comprises an insulating liner wrapping around and underlining the low-k dielectric material.

9. The semiconductor device according to claim 1, wherein the channel isolation structure further comprises a capping layer covering a top surface of the low-k dielectric material.

10. The semiconductor device according to claim 9, wherein the capping layer is formed in a recess defined by a top portion of the low-k dielectric material.

11. The semiconductor device according to claim 9, wherein the top surface of the low-k dielectric material is entirely covered by the capping layer.

12. A semiconductor device, comprising:
- a channel structure, protruded from an isolation structure formed on a substrate, and extending along a first direction;
- a channel isolation structure, extending between two separate sections of the channel structure along a second direction, wherein a wall portion of the channel isolation structure is located on the isolation structure, a protruding portion of the channel isolation structure extends into the substrate through the isolation structure, and a low-k dielectric material in the channel isolation structure comprises boron nitride; and
- a gate structure, extending on the isolation structure along the second direction, and having two separate sections at opposite sides of the channel isolation structure and aligned with the channel isolation structure.

13. The semiconductor device according to claim 12, further comprising:
- first and second gate isolation structures, extending along the first direction on the isolation structure, wherein the channel isolation structure is in lateral contact with the two separate sections of the channel structure through the first and second gate isolation structures.

14. The semiconductor device according to claim 13, wherein the first and second gate isolation structures each have a top width and a bottom width shorter than the top width, and the wall portion of the channel isolation structure has a top width and a bottom width greater than the top width.

* * * * *